(12) United States Patent
Subramanian et al.

(10) Patent No.: US 6,190,062 B1
(45) Date of Patent: Feb. 20, 2001

(54) CLEANING CHAMBER BUILT INTO SEM FOR PLASMA OR GASEOUS PHASE CLEANING

(75) Inventors: Ramkumar Subramanian; Khoi A. Phan, both of San Jose; Bharath Rangarajan, Santa Clara; Bhanwar Singh, Morgan Hill; Bryan K. Choo, Mountain View; Sanjay K. Yedur, Santa Clara, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/558,492

(22) Filed: Apr. 26, 2000

(51) Int. Cl.[7] .................................................. G03D 13/00
(52) U.S. Cl. ........................................... 396/578; 396/579
(58) Field of Search .................................. 355/53, 27–29, 355/77; 396/578, 579; 118/52, 316, 319, 500; 361/231; 134/1, 2, 4, 157, 902; 250/398

(56) References Cited

U.S. PATENT DOCUMENTS

| | | | |
|---|---|---|---|
| 4,778,536 | 10/1988 | Grebinski | 134/36 |
| 4,827,371 | * 5/1989 | Yost | 361/231 |
| 5,037,506 | 8/1991 | Gupta et al. | 156/646 |
| 5,346,586 | 9/1994 | Keller | 156/656 |
| 5,356,478 | 10/1994 | Chen et al. | 134/1 |
| 5,423,944 | 6/1995 | Wong | 156/646.1 |
| 5,486,267 | 1/1996 | Knight et al. | 156/659.11 |
| 5,712,198 | 1/1998 | Shive et al. | 437/235 |
| 5,753,137 | 5/1998 | Ye et al. | 252/79.1 |
| 5,763,016 | 6/1998 | Levenson et al. | 427/510 |
| 5,849,639 | 12/1998 | Molloy et al. | 438/714 |
| 5,944,907 | 8/1999 | Ohmi | 134/1.3 |
| 5,981,960 | * 11/1999 | Ooach et al. | 250/398 |
| 6,024,887 | 2/2000 | Kuo et al. | 216/48 |

FOREIGN PATENT DOCUMENTS

| | | |
|---|---|---|
| 63-188942 | * 8/1988 | (JP). |
| 4-75323 | * 3/1992 | (JP). |
| 6-77197 | * 3/1994 | (JP). |

* cited by examiner

*Primary Examiner*—D. Rutledge
(74) *Attorney, Agent, or Firm*—Amin, Eschweiler & Turocy, LLP

(57) ABSTRACT

One aspect of the present invention relates to a method of inspecting a patterned substrate using an SEM, involving the steps of evaluating the patterned substrate to determine if charges exist thereon; introducing the patterned substrate having charges thereon into a processing chamber of the SEM; inspecting the patterned resist using an electron beam generated by the SEM; and introducing a cleaner containing ozone into the processing chamber of the SEM. Another aspect of the present invention relates to a system for processing a patterned substrate, containing a charge sensor for determining if charges exist on the patterned substrate and measuring the charges; a means for contacting the patterned substrate with a cleaner containing ozone to reduce the charges thereon; a controller for setting at least one of time of contact between the patterned substrate and the cleaner, temperature of the cleaner, concentration of ozone in the cleaner, and pressure under which contact between the patterned substrate and the cleaner occurs; and a device for inspecting the patterned substrate with an electron beam.

22 Claims, 3 Drawing Sheets

CLEANING CHAMBER BUILT INTO SEM FOR PLASMA OR GASEOUS PHASE CLEANING

TECHNICAL FIELD

The present invention generally relates to improving critical dimension measurements. In particular, the present invention relates to incorporating a cleaning chamber into a scanning electron microscope to reduce the number of charged defects that interfere with measuring critical dimension.

BACKGROUND ART

Microlithography processes for making miniaturized electronic components, such as in the fabrication of computer chips and integrated circuits, are of increasing importance as the trend towards miniaturization and integration continues. Lithography involves the use of resists to temporarily mask a semiconductor substrate surface to enable site specific additive, subtractive, or enhancing processing (e.g., deposition, etching, doping). Lithography specifically involves applying a coating or film of a resist to a substrate material, such as a silicon wafer used for making integrated circuits. The substrate may contain any number of layers or devices thereon.

The resist coated substrate is baked to evaporate any solvent in the resist composition and to fix the resist coating onto the substrate. The baked coated surface of the substrate is next subjected to selective radiation; that is, an image-wise exposure to radiation. This radiation exposure causes a chemical transformation in the exposed areas of the resist coated surface. Types of radiation commonly used in microlithographic processes include visible light, ultraviolet (UV) light and electron beam radiant energy. After selective exposure, the resist coated substrate is treated with a developer solution to dissolve and remove either the radiation-exposed or the unexposed areas of the resist (depending upon whether a positive resist or a negative resist is utilized) resulting in a patterned or developed resist. Many developer solutions contain water and a base, such as water and a hydroxide compound.

Treating a selectively exposed resist with a developer conventionally involves depositing the liquid developer solution over the resist clad substrate and spinning the substrate whereby the liquid developer solution and dissolved areas of the resist are removed from the substrate by centrifugal forces. A rinsing solution, typically deionized water, is then deposited over the resist clad substrate and the substrate is spun again to remove the water and any debris solubilized by the water. Spinning the substrate is a convenient and inexpensive method of removing materials from substrate.

The patterned resist covered substrate is then subject to standard semiconductor processing such as material deposition, etching, or doping. Since the patterned resist only covers a portion of the substrate, the standard semiconductor processing techniques impact desired areas of the substrate. This is the basis for fabricating integrated circuit chips.

Prior to subjecting the patterned resist covered substrate to standard semiconductor processing, the patterned resist is inspected to ensure that certain requirements/parameters are satisfied. For example, the patterned resist may be inspected to access one or more of pattern position accuracy, feature size control, feature edge roughness, and defect density. One aspect of feature size control is critical dimension control, which is measured/accessed using a scanning electron microscope (SEM) or an atomic force microscope (AFM). SEMs and AFMs use an electron beam for generating images (both in projection and detection).

However, electrostatic charges build up on the patterned photoresist by the interaction of the electron beam with the photoresist material. Negative charges are particularly encountered on patterned photoresists. Electrostatic charge accumulation on patterned photoresists can be as high as 300–400 volts/cm$^2$. This undesirable charge accumulation attracts airborne defects, even in a vacuum, onto the patterned photoresists. Such defects at best deleteriously effect the critical dimension control measurement of photoresist features, and at worst cause fatal defects during subsequent standard semiconductor processing.

Moreover, even in instances where there are no electrostatic charges associated with the patterned photoresist, airborne defects, such as carbon containing particles, may interfere with critical dimension control measurements. Airborne defects may be attributable to insufficient prior cleaning, or to a previously processed patterned photoresist.

SUMMARY OF THE INVENTION

The present invention provides systems and a cleaning process to improve critical dimension control measurements. The systems and processes of the present invention minimize and/or eliminate debris within an SEM or AFM chamber when a charge measurement indicates that the presence of such debris is likely. The present invention also provides systems and methods for detecting and minimizing the presence of defects on patterned resist covered semiconductor substrates. As a result of the present invention, inspection of patterned resists and post-lithography semiconductor processing are substantially improved.

One aspect of the present invention relates to a method of inspecting a patterned substrate using an SEM, involving the steps of evaluating the patterned substrate to determine if charges exist thereon; introducing the patterned substrate having charges thereon into a processing chamber of the SEM; inspecting the patterned resist using an electron beam generated by the SEM; and introducing a cleaner containing ozone into the processing chamber of the SEM.

Another aspect of the present invention relates to a method of improving critical dimension measurements of a patterned resist using an SEM, involving the steps of providing a semiconductor structure having a patterned resist thereon in a processing chamber of the SEM; evaluating the semiconductor structure having the patterned resist thereon to determine if electrostatic charges exist on the patterned resist; measuring the critical dimension of the patterned resist on the semiconductor structure using the SEM; and introducing a cleaner in a form of at least one of a gas and a plasma into the processing chamber while measuring the critical dimension, the cleaner containing ozone, and optionally at least one inert gas thereby reducing an amount of debris on the patterned resist.

Yet another aspect of the present invention relates to a system for processing a patterned substrate, containing a charge sensor for determining if charges exist on the patterned substrate and measuring the charges; a means for contacting the patterned substrate with a cleaner containing ozone to reduce the charges thereon; a controller for setting at least one of time of contact between the patterned substrate and the cleaner, temperature of the cleaner, concentration of ozone in the cleaner, and pressure under which contact between the patterned substrate and the cleaner occurs; and a device for inspecting the patterned substrate with an electron beam.

Still yet another aspect of the present invention relates to a system for processing a semiconductor substrate having a patterned resist thereon, containing a charge sensor for determining if electrostatic charges exist on the patterned resist and measuring the electrostatic charges; a means for contacting the patterned resist with a cleaner containing ozone to reduce the electrostatic charges thereon; a microprocessor-controller for setting at least one of time of contact between the patterned resist and the cleaner, temperature of the cleaner, concentration of ozone in the cleaner, and pressure under which contact between the patterned resist and the cleaner occurs; and a scanning electron microscope for inspecting the patterned resist with an electron beam.

DISCLOSURE OF INVENTION

Figure 1:
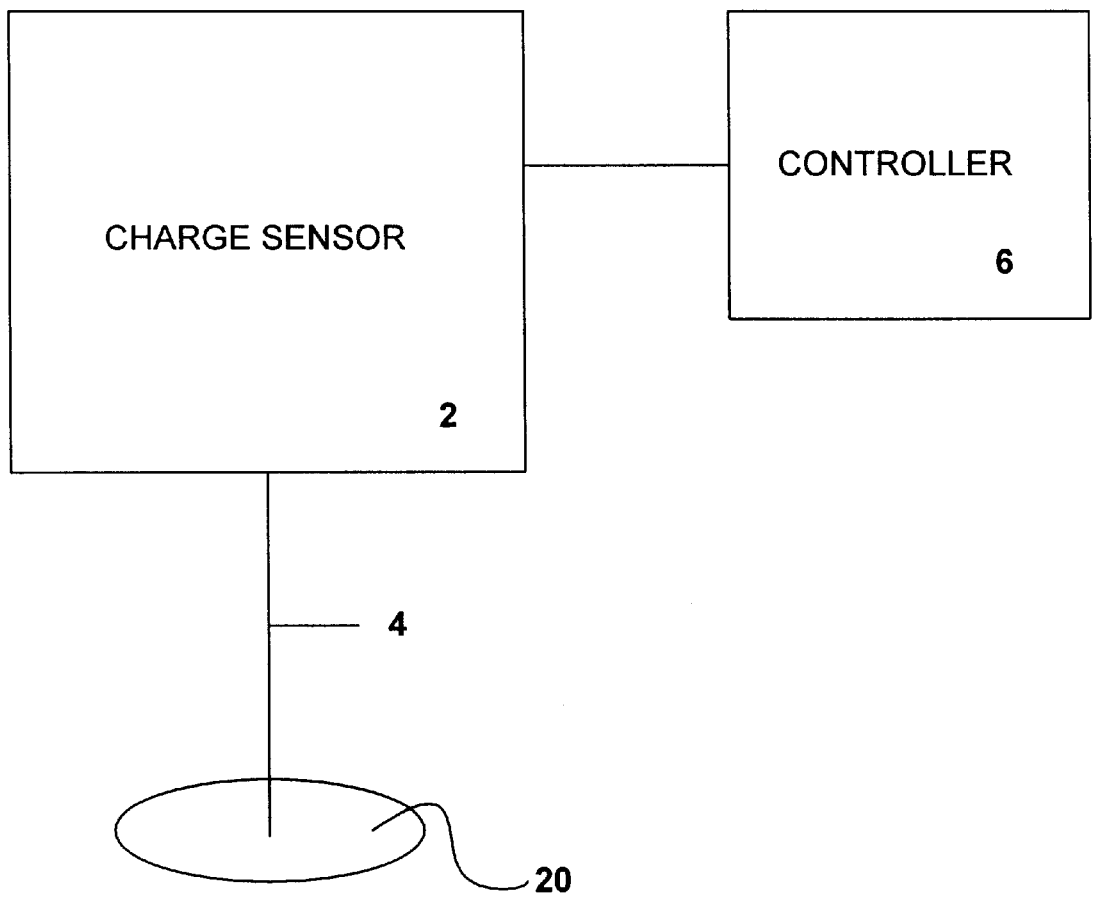
FIG. 1 is a general schematic illustration of several aspects of determining whether charges exist on a patterned substrate in accordance with the present invention.

The present invention involves improving the inspection of a patterned resist by reducing undesirable debris on the patterned resist and within the inspection chamber. The present invention more specifically involves determining if a charge exists on a patterned substrate, and if a charge exists, contacting the inspection chamber with a cleaner containing at least ozone which, in turn, effectively reduces the amount of debris/defects on the on the patterned substrate and/or within the inspection chamber during or just before inspection of the patterned substrate.

During lithography, a resist is provided over a semiconductor substrate. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The resist is provided over at least a portion of the substrate, but typically over the entire substrate.

Any suitable resist may be applied to the substrate surface by any suitable means. For example, a 157 nm photoresist, a 193 nm photoresist, a 13 nm photoresist, an 11 nm photoresist, an I-line, H-line, G-line, E-line, deep UV, extreme UV, X-ray resist, electron beam resist or chemically amplified photoresist material may be spin-coated on the substrate surface. Spin-coating involves depositing the resist in a solution over a spinning substrate. The centrifugal forces of the spinning substrate serve to evenly distribute the resist over the substrate.

Positive or negative resists may be used, but positive resists are preferred. Resists are commercially available from a number of sources, including Shipley Company, DuPont, Arch Chemical, Aquamer, Hunt, Hoechst Celanese Corporation, Clariant, JSR Microelectronics, and Brewer. The resist is typically applied to a thickness from about 2,000 Å to about 30,000 Å, although the thickness of the resist is not critical to the invention.

Optionally after the resist is applied to the substrate surface, the resist covered substrate is subjected to a soft bake to drive off excess solvent and/or to increase adhesion with the substrate surface. The soft bake involves heating at an elevated temperature for a suitable period of time.

The resist covered substrate is selectively exposed to actinic radiation or electron beams to cause a chemical transformation in desired regions of the resist. The wavelength of radiation is not critical to the invention, as it depends primarily upon the identity of the resist material, and particularly, upon the identity of the photoactive compound in the resist material. A mask is typically employed to selectively expose the resist to an image-wise exposure of radiation.

The selectively exposed resist is developed using a suitable developer, such as an aqueous developer. The specific identity of the developer is not critical to the invention, but typically an aqueous alkaline solution is employed. For example, an aqueous tetramethylammonium hydroxide solution is employed as a developer solution. The developer solution is deposited over a spinning resist clad substrate. The spinning action serves to uniformly spread the developer over and then off of the resist clad substrate.

During development, either the exposed portion of the resist (in embodiments where a positive resist is employed) or the unexposed portion of the resist (in embodiments where a negative resist is employed) is soluble or is solubilized in the developing solution. The portion of the resist that is not substantially soluble in the developing solution remains on the substrate. Development results in a patterned resist (the remaining portion of the resist) over the substrate surface.

Optionally, further processing (such as an etch process) is conducted, followed by removing or stripping the patterned resist thereby resulting in a patterned substrate. Thus, the patterned substrate as used herein includes a patterned resist covered substrate, a patterned insulation layer covered substrate, a patterned conductive layer covered substrate, a patterned silicon containing layer covered substrate (such as polysilicon or amorphous silicon), and the like.

The patterned substrate is next evaluated to determine if indeed electrostatic charges have accumulated thereon. If it is determined that electrostatic charges have accumulated on the patterned substrate, a determination is made to approximate the magnitude of the accumulated electrostatic charges. Determining whether electrostatic charges exist and their magnitude is accomplished using a measuring device, such as an electrostatic charge sensor having a probe. The electrostatic charge sensor can measure the voltage on the patterned substrate. The measuring device, such as the electrostatic charge sensor, may be coupled to a microprocessor-controller which automatically sets the time, temperature, pressure, and concentration for contacting the cleaner with the patterned substrate, described below. Evaluation of the patterned substrate may be conducted in an evaluation chamber, a cleaning chamber, or an SEM chamber.

Next, if it is determined that electrostatic charges have accumulated on the patterned substrate, a cleaner is contacted with the processing chamber containing the patterned substrate, or a cleaner is contacted with the patterned substrate just prior to inserting the patterned substrate into the processing chamber, in any suitable manner. While not wishing to be bound by any theory, it is believed that the cleaner oxidizes debris/defects, which can then be removed through the air. For instance, the cleaner can oxidize carbon containing resist debris into carbon dioxide, which can be removed by vacuum or an exhaust. The debris/defects may be airborne or associated with the patterned substrate, especially if the patterned substrate is an electrostatically charged patted resist.

The cleaner is produced within or introduced directly into the processing chamber containing the SEM, or alternatively, a cleaning chamber is connected to the processing chamber to permit the cleaner to oxidize debris/defects that are airborne and/or on the patterned substrate.

In embodiments where the patterned substrate is a patterned resist, it is noted that contacting the processing chamber with the cleaner does not strip the patterned resist from the substrate. In this connection, the conditions and methods set forth herein are suited for cleaning or removing defects from a patterned resist, not for stripping a patterned resist from a substrate. The actions of stripping a patterned resist from a substrate are separate and distinct from the methods of the present invention.

In one embodiment, the cleaner employed in the SEM processing chamber is in the form of a plasma. In another embodiment, the cleaner employed in the SEM processing chamber is in the form of a gas. In yet another embodiment, the cleaner employed in the SEM processing chamber is in the form of a mixture of a plasma and a gas.

The cleaner contains at least ozone. In one embodiment, the cleaner further contains at least one inert gas, including nitrogen and the noble gases. Noble gases include argon, helium, neon, krypton, and xenon. In another embodiment, the cleaner further contains sulfur trioxide. Thus, in one embodiment, the cleaner contains sulfur trioxide and ozone.

In one embodiment, the cleaner does not contain water. In another embodiment, the cleaner does not contain oxygen. In yet another embodiment, the cleaner does not contain a peroxide. In still yet another embodiment, the cleaner does not contain sulfuric acid. In this connection, in one embodiment, the cleaner consists essentially of ozone, and optionally at least one inert gas, and/or sulfur trioxide.

The ozone plasma/gas may be derived from any suitable ozone source. For example, ozone may be derived from oxygen using an ozone generator. Methods of making ozone are known in the art. Inert plasma/gas may be derived from any suitable nitrogen or noble gas source.

The sulfur trioxide plasma/gas may be derived from any suitable sulfur trioxide source. For example, liquid sulfur trioxide, which is primarily in gamma form, may be used as a source for sulfur trioxide gas and plasma. In a preferred embodiment, the sulfur trioxide source is in the gamma form. In general, stabilized gamma sulfur trioxide is used, where addition of a small quantity of inhibitor (stabilizer) prevents formation of the high melting-point beta and alpha forms. However, the beta and alpha forms sulfur trioxide may be employed. Gamma-sulfur trioxide is commercially available with such inhibitors. The stabilized sulfur trioxide can readily be remelted, if it is allowed to solidify. Gaseous sulfur trioxide may also be used as a source for sulfur trioxide gas and plasma. Gaseous sulfur trioxide can be obtained by oxidizing sulfur dioxide in the presence of a catalyst, such as platinum or vanadium pentoxide ($V_2O_5$).

The cleaner employed in the SEM processing chamber is contacted with the patterned substrate and/or SEM processing chamber for a time sufficient for the ozone and optionally the inert gases and/or sulfur trioxide to reduce, minimize and/or eliminate debris/defects within the chamber and/or on the patterned substrate surface. The time of which the cleaner is employed in the SEM processing chamber is typically from about 1 second to about 1 hour. In another embodiment, the cleaner is employed in the SEM processing chamber for a period of time from about 5 seconds to about 10 minutes. In yet another embodiment, the cleaner is employed in the SEM processing chamber for a period of time from about 10 seconds to about 2 minutes.

In one embodiment where a plasma is employed, the plasma cleaner contains from about 10 sccm to about 10 slm of ozone, and optionally from about 0 sccm to about 10 slm of at least one inert gas and/or sulfur trioxide. In another embodiment, the plasma cleaner contains from about 25 sccm to about 5 slm of ozone, and optionally from about 10 sccm to about 10 slm of at least one inert gas and/or sulfur trioxide. In yet another embodiment, the plasma cleaner contains from about 50 sccm to about 1 slm of ozone, and optionally from about 25 sccm to about 5 slm of at least one inert gas and/or sulfur trioxide.

In one embodiment where a gas is employed, the gas cleaner contains from about 1% to about 100% by weight of ozone, and optionally from about 0% to about 99% by weight of at least one inert gas and/or sulfur trioxide. In another embodiment, the gas cleaner contains from about 3% to about 95% by weight of ozone, and optionally from about 5% to about 97% by weight of at least one inert gas and/or sulfur trioxide. In yet another embodiment, the gas cleaner contains from about 5% to about 90% by weight of ozone, and optionally from about 10% to about 95% by weight of at least one inert gas and/or sulfur trioxide.

Any suitable pressure may be employed when using the plasma and/or gas cleaner. In one embodiment, the pressure in the processing chamber is from about 0.0001 Torr to about 1,000 Torr when using a plasma cleaner. In another embodiment, the pressure in the processing chamber is from about 0.001 Torr to about 500 Torr when using a plasma cleaner. In one embodiment, the pressure in the processing chamber is from about 10 Torr to about 1,500 Torr when using a gas cleaner. In another embodiment, the pressure in the processing chamber is from about 25 Torr to about 1,000 Torr when using a gas cleaner.

The temperature employed while using the cleaner is typically from about 10° C. to about 500° C. In one embodiment, the temperature employed while using the cleaner is from about 20° C. to about 400° C. In another embodiment, the temperature employed while using the cleaner is from about 30° C. to about 300° C. The temperature is maintained to maximize the reduction of debris/defects within the SEM processing chamber and/or on the patterned substrate, while not substantially damaging or degrading the patterned substrate surface (or the surface underlying the patterned resist) or interfering with the operation of the SEM.

The cleaner is contacted with the patterned substrate for a time, at a temperature, at a pressure, at a concentration sufficient for the cleaner to reduce, minimize and/or eliminate charges on the patterned substrate. The time, temperature, pressure, and concentration are set based upon the magnitude of the accumulated electrostatic charges measured during the evaluation step discussed above. For example, patterned substrates having relatively low charges thereon are contacted with relatively low concentrations of the ozone, whereas patterned substrates having relatively high charges thereon are contacted with relatively high concentrations of ozone.

Comparing the patterned substrate surface before and after contact with the cleaner, the substrate surface after contact has at least about 75% less debris/defects thereon (for example, by weight) than the patterned substrate surface before contact, and the SEM processing chamber has at least about 75% less debris therein than the SEM processing chamber before introduction of the cleaner. In another embodiment, the substrate surface after contact has at least about 90% less debris/defects thereon than the patterned surface before contact, and the SEM processing chamber has at least about 90% less debris therein than the SEM processing chamber before introduction of the cleaner. In yet another embodiment, the substrate surface after contact has at least about 98% less debris/defects thereon than the patterned surface before contact, and the SEM processing chamber has at least about 98% less debris therein than the SEM processing chamber before introduction of the cleaner. In still yet another embodiment, the patterned surface and/or the SEM processing chamber have no detectable debris/defects.

Once the debris/defects are oxidized, they can be removed from the processing chamber by vacuum, exhaust, or other suitable means. In instances where carbon containing debris are oxidized into carbon dioxide, a vacuum or exhaust is particularly effective in removing such materials from the processing chamber.

The patterned substrate is then inspected to access or measure one or more of pattern position accuracy, feature size, feature size control, feature edge roughness, defect density, and the like using and AFM or an SEM (collectively hereinafter referred to as SEM). The inspection is carried out in a processing chamber. In one embodiment, the inspection involves measuring critical dimension control. In another embodiment, the inspection involves generating profile data.

Due to cleaning the patterned substrate and/or the SEM processing chamber, more accurate and reliable data evaluating the patterned substrate may be obtained using the SEM. For example, critical dimension control measurements of increased accuracy of a patterned resist may be obtained.

Figure 2:
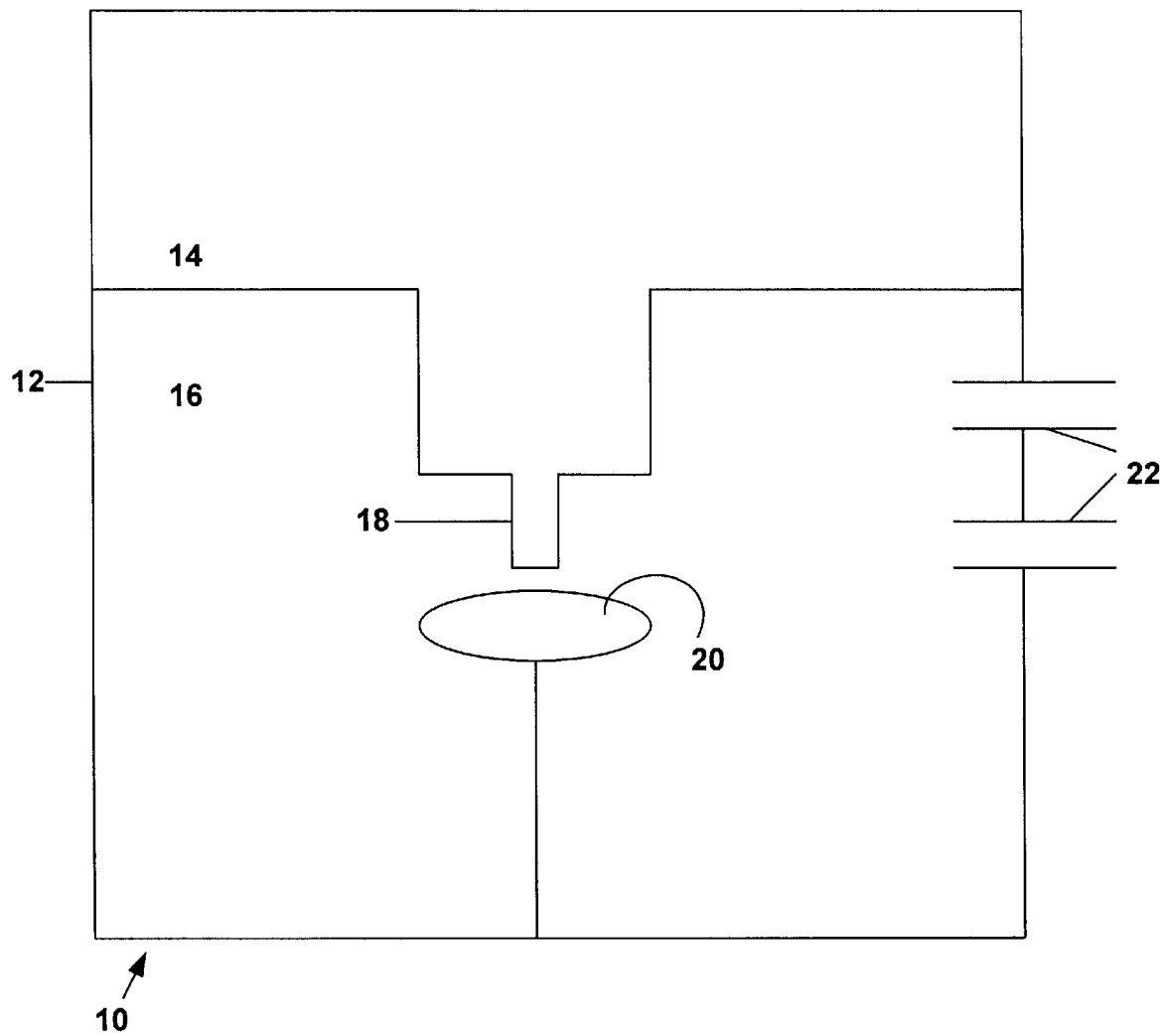
FIG. 2 is a general schematic illustration of several aspects of minimizing defects on a patterned substrate in accordance with the present invention.
Figure 3:
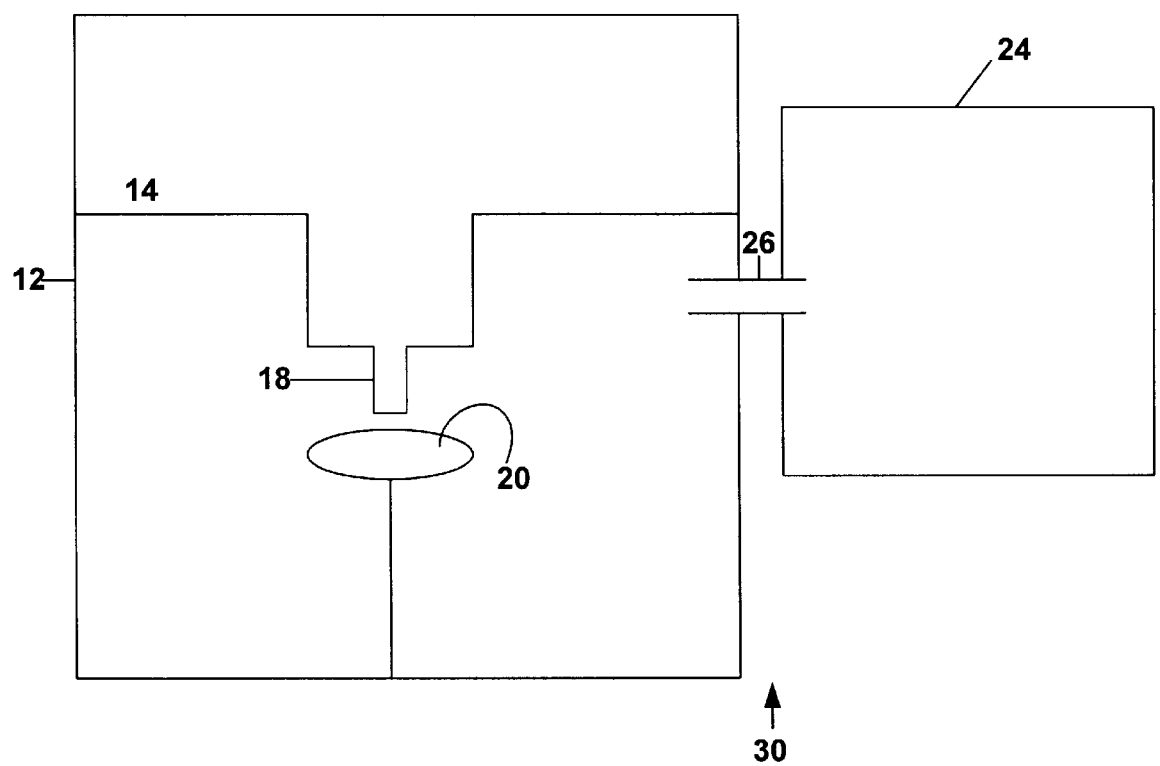
FIG. 3 is a general schematic illustration of several aspects of minimizing defects on a patterned substrate in accordance with the present invention.

Referring to FIGS. 1 to 3, various aspects of the present invention are illustrated. One embodiment of the present invention is illustrated in FIGS. 1 and 2, where a system and method for detecting the presence of electrostatic charges on a patterned resist covered substrate, cleaning the patterned resist covered substrate, and inspecting the patterned resist covered substrate is shown.

Referring to FIG. 1, a charge sensor 2 having a probe 4 measures the accumulated electrostatic charges, if any, on a patterned resist covered substrate 20 (the patterned photoresist is not explicitly shown). The charge sensor 2 is coupled to a controller 6 capable of determining conditions (such as time, temperature, pressure, and concentration) associated with the subsequent contact with a cleaner required to reduce, minimize and/or eliminate the electrostatic charges and/or defects. If charge sensor 2 does not detect any accumulated electrostatic charges, the patterned resist covered substrate 20 may proceed to further semiconductor processing. If, to the contrary, charge sensor 2 detects accumulated electrostatic charges, a cleaner is contacted with the patterned resist covered substrate 20, under conditions set by the controller 6.

Referring to FIG. 2, a system 10 for cleaning the patterned resist covered substrate having accumulated electrostatic charges thereon and an SEM processing chamber is provided. The system 10 includes SEM 12, which in turn includes an SEM apparatus 14, an SEM processing chamber 16, and a probe tip 18. A patterned resist covered substrate 20 is positioned within the SEM processing chamber 16. The chamber 16 is equipped with inlets 22 for introducing a cleaning plasma and/or gas. Although not shown, the inlets are coupled with sources of at least ozone (plasma and/or gas) and optionally an inert gas. The cleaning plasma and/or gas may be introduced into the SEM processing chamber 16 through the inlets 22 immediately before and while the SEM 12 evaluates the patterned resist covered substrate 20 by emitting an electron beam from the probe tip 18.

Another embodiment of the present invention is illustrated in FIGS. 1 and 3, where a system and method for detecting the presence of electrostatic charges on a patterned resist covered substrate, cleaning the patterned resist covered substrate, and inspecting the patterned resist covered substrate is shown. FIG. 1 is discussed above. Specifically referring to FIG. 3, a system 30 for cleaning a patterned resist covered substrate and an SEM processing chamber is provided. The system 30 includes SEM 12, which in turn includes an SEM apparatus 14, an SEM processing chamber 16, and a probe tip 18, and cleaning chamber 24. The cleaning chamber 24 is coupled to the SEM processing chamber 16 via connecter 26. A patterned resist covered substrate 20 is positioned within the SEM processing chamber 16. The cleaning chamber 24 is equipped with sources of ozone (plasma and/or gas) for introducing a cleaning plasma and/or gas into the SEM processing chamber 16. The cleaning plasma and/or gas may be introduced into the SEM processing chamber 16 as the SEM 12 evaluates the patterned resist covered substrate 20 by emitting an electron beam from the probe tip 18.

After inspection of the patterned substrate, various semiconductor processing is performed, taking advantage of the patterned substrate/resist. In particular, in embodiments where the patterned substrate is a patterned resist, materials may be deposited over the patterned resist covered substrate surface, exposed areas of the substrate surface may be etched, or exposed areas of the substrate surface may be doped or otherwise treated. After semiconductor processing is completed, the patterned resist is removed or stripped from the substrate using any suitable means. Stripping typically involves contacting the patterned resist with a stripper solution, such as a strong hydroxide solution, or a plasma stripper, such as oxygen plasma.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of inspecting a patterned substrate using an SEM, comprising:

evaluating the patterned substrate to determine if charges exist thereon;

introducing the patterned substrate having charges thereon into a processing chamber of the SEM;

inspecting the patterned resist using an electron beam generated by the SEM; and introducing a cleaner comprising ozone into the processing chamber of the SEM.

2. The method of claim 1, wherein the cleaner further comprises at least one of nitrogen, helium, neon, argon, krypton, and xenon.

3. The method of claim 1, wherein the cleaner is a plasma.

4. The method of claim 3, wherein the plasma comprises from about 10 sccm to about 10 slm of ozone, and optionally at least one of from about 0 sccm to about 10 slm of at least one inert gas and from about 0 sccm to about 10 slm of sulfur trioxide.

5. The method of claim 3, wherein the plasma is introduced under a pressure from about 0.0001 Torr to about 1,000 Torr at a temperature from about 10° C. to about 500° C. for a time from about 1 second to about 1 hour.

6. The method of claim 1, wherein the cleaner is a gas.

7. The method of claim 6, wherein the gas comprises from about 1% to about 100% by weight of ozone, and optionally at least one of from about 0% to about 99% by weight of at least one inert gas and from about 0% to about 99% by weight of sulfur trioxide.

8. The method of claim 6, wherein the gas is introduced under a pressure from about 10 Torr to about 1,500 Torr at a temperature from about 10° C. to about 500° C. for a time from about 1 second to about 1 hour.

9. A method of improving critical dimension measurements of a patterned resist using an SEM, comprising:

providing a semiconductor structure having a patterned resist thereon in a processing chamber of the SEM;

evaluating the semiconductor structure having the patterned resist thereon to determine if electrostatic charges exist on the patterned resist;

measuring the critical dimension of the patterned resist on the semiconductor structure using the SEM; and introducing a cleaner in a form of at least one of a gas and a plasma into the processing chamber while measuring the critical dimension, the cleaner comprising ozone, and optionally at least one inert gas thereby reducing an amount of debris on the patterned resist.

10. The method of claim 9, wherein the inert gas is at least one of nitrogen, argon, helium, neon, krypton, and xenon.

11. The method of claim 9, wherein the cleaner comprises a gas comprising from about 3% to about 95% by weight of ozone, and optionally from about 5% to about 97% by weight of at least one inert gas.

12. The method of claim 11, wherein the gas is introduced under a pressure from about 25 Torr to about 1,000 Torr at a temperature from about 20° C. to about 400° C. for a time from about 5 seconds to about 10 minutes.

13. The method of claim 9, wherein the cleaner comprises a plasma comprising from about 25 sccm to about 5 slm of ozone, and optionally from about 10 sccm to about 10 slm of at least one inert gas.

14. The method of claim 13, wherein the plasma is introduced under a pressure from about 0.001 Torr to about 500 Torr at a temperature from about 20° C. to about 400° C. for a time from about 5 seconds to about 10 minutes.

15. The method of claim 9, wherein the semiconductor structure after contact with at least one of the gas and the plasma has at least about 90% less carbon containing debris than the semiconductor structure before contact.

16. A system for processing a patterned substrate, comprising:

a charge sensor for determining if charges exist on the patterned substrate and measuring the charges;

a means for contacting the patterned substrate with a cleaner comprising ozone to reduce the charges thereon;

a controller for setting at least one of time of contact between the patterned substrate and the cleaner, temperature of the cleaner, concentration of ozone in the cleaner, and pressure under which contact between the patterned substrate and the cleaner occurs; and a device for inspecting the patterned substrate with an electron beam.

17. The system of claim 16, wherein the charge sensor is an electrostatic charge sensor.

18. The system of claim 16, wherein the means for contacting the patterned substrate with the cleaner is a plasma chamber.

19. The system of claim 16, wherein the controller is coupled to the charge sensor and the means for contacting the patterned substrate with the cleaner.

20. The system of claim 16, wherein the controller sets at least one of time of contact between the patterned photoresist and the positive ion carrier and concentration of positive ions in the positive ion carrier.

21. The system of claim 16, wherein the device for inspecting the patterned substrate with an electron beam is one of a scanning electron microscope and an atomic force microscope.

22. A system for processing a semiconductor substrate having a patterned resist thereon, comprising:

a charge sensor for determining if electrostatic charges exist on the patterned resist and measuring the electrostatic charges;

a means for contacting the patterned resist with a cleaner comprising ozone to reduce the electrostatic charges thereon;

a microprocessor-controller for setting at least one of time of contact between the patterned resist and the cleaner, temperature of the cleaner, concentration of ozone in the cleaner, and pressure under which contact between the patterned resist and the cleaner occurs; and a scanning electron microscope for inspecting the patterned resist with an electron beam.

* * * * *